(12) United States Patent
Goh et al.

(10) Patent No.: US 9,054,063 B2
(45) Date of Patent: Jun. 9, 2015

(54) HIGH POWER SINGLE-DIE SEMICONDUCTOR PACKAGE

(71) Applicant: Infineon Technologies AG, Neubiberg (DE)

(72) Inventors: Kok Chai Goh, Melaka (MY); Meng Tong Ong, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/857,252

(22) Filed: Apr. 5, 2013

(65) Prior Publication Data

US 2014/0299981 A1    Oct. 9, 2014

(51) Int. Cl.
| | |
|---|---|
| *H01L 23/34* | (2006.01) |
| *H01L 21/78* | (2006.01) |
| *H01L 23/31* | (2006.01) |
| *H01L 23/36* | (2006.01) |
| *H01L 23/492* | (2006.01) |
| *H01L 21/683* | (2006.01) |

(52) U.S. Cl.
CPC .............. *H01L 23/34* (2013.01); *H01L 21/78* (2013.01); *H01L 2224/73253* (2013.01); *H01L 23/3185* (2013.01); *H01L 23/36* (2013.01); *H01L 23/492* (2013.01); *H01L 2924/13091* (2013.01); *H01L 21/6835* (2013.01); *H01L 21/6836* (2013.01); *H01L 2221/68327* (2013.01); *H01L 2221/6834* (2013.01); *H01L 2924/13055* (2013.01); *H01L 2924/1305* (2013.01); *H01L 2924/13062* (2013.01)

(58) Field of Classification Search
CPC ... H01L 23/34; H01L 23/492; H01L 23/3185; H01L 23/36; H01L 21/78; H01L 21/6835
USPC .......................................................... 257/712
See application file for complete search history.

(56) References Cited

U.S. PATENT DOCUMENTS

| | | | | |
|---|---|---|---|---|
| 5,783,854 | A | * | 7/1998 | Dries et al. ..................... 257/467 |
| 2003/0176015 | A1 | * | 9/2003 | Yoon et al. ..................... 438/106 |
| 2008/0197367 | A1 | * | 8/2008 | Cai et al. .......................... 257/94 |
| 2009/0108288 | A1 | * | 4/2009 | Ozeki et al. ..................... 257/133 |
| 2009/0218590 | A1 | * | 9/2009 | Cai et al. .......................... 257/99 |
| 2010/0283074 | A1 | * | 11/2010 | Kelley et al. ..................... 257/98 |
| 2013/0130443 | A1 | * | 5/2013 | Lu et al. .......................... 438/113 |

* cited by examiner

*Primary Examiner* — Ahmed Sefer
(74) *Attorney, Agent, or Firm* — Murphy, Bilak & Homiller, PLLC

(57) ABSTRACT

A semiconductor package includes a single semiconductor die and an electrically and thermally conductive base. The single semiconductor die includes a semiconductor body having opposing first and second surfaces and insulated sides between the first and second surfaces. The single semiconductor die further includes a first electrode at the first surface and a second electrode at the second surface. The single semiconductor die has a defined thickness measured between the first and second surfaces, a defined width measured along one of the insulated sides, and a defined length measured along another one of the insulated sides. The base is attached to the second electrode at the second surface of the single semiconductor die and has the same length and width as the single semiconductor die.

13 Claims, 10 Drawing Sheets

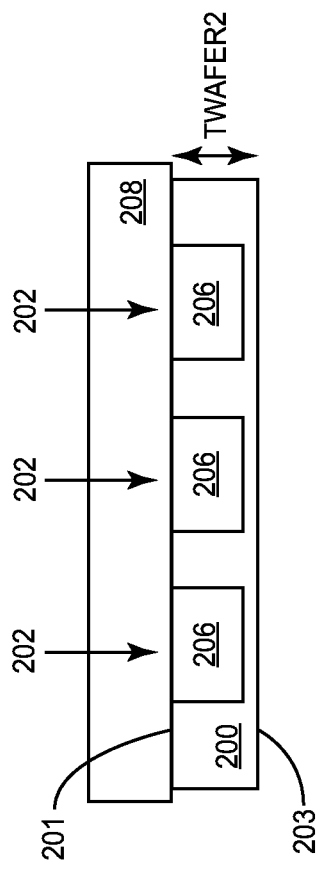
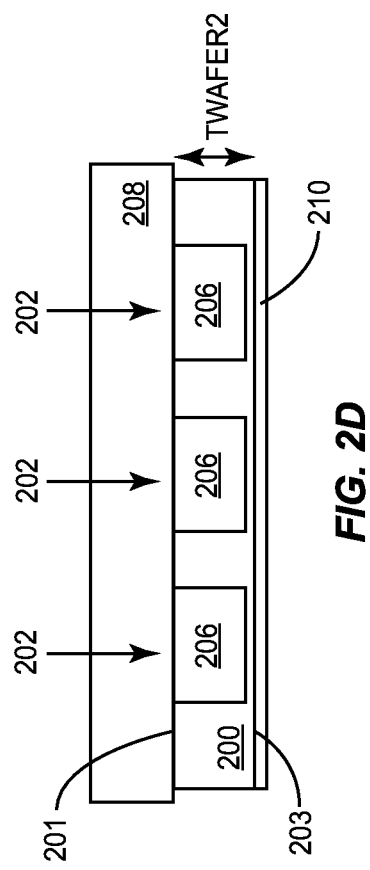

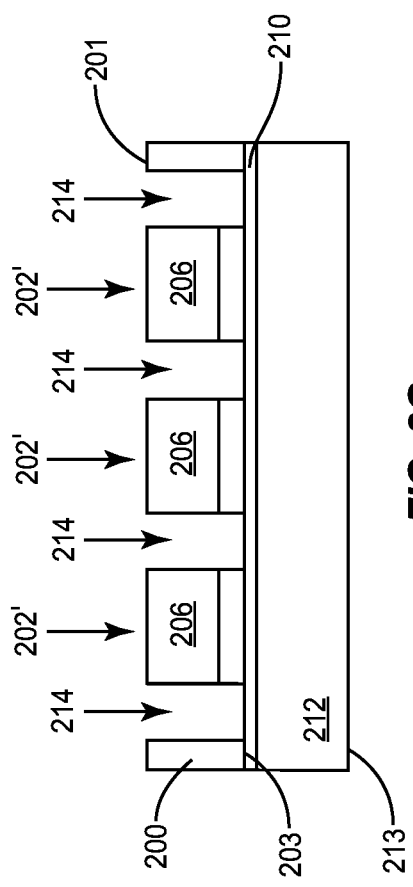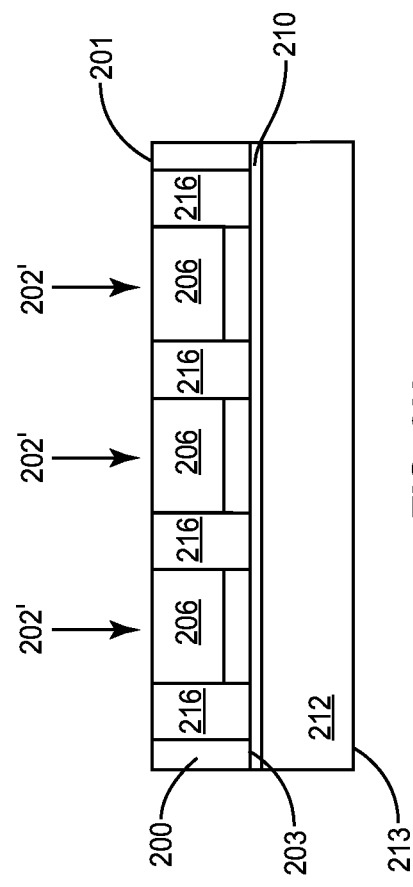

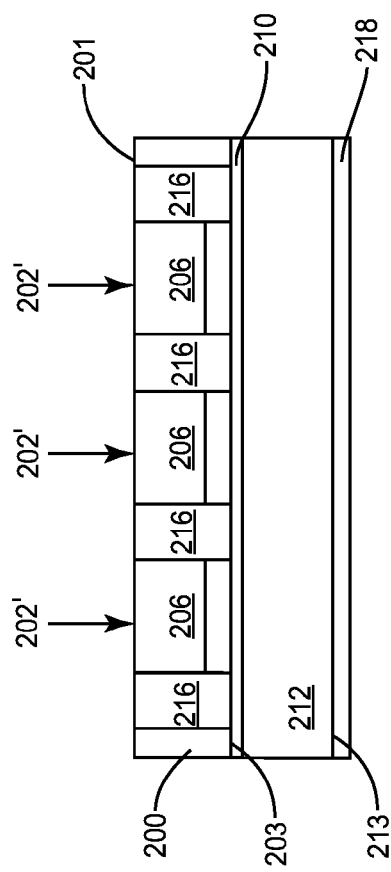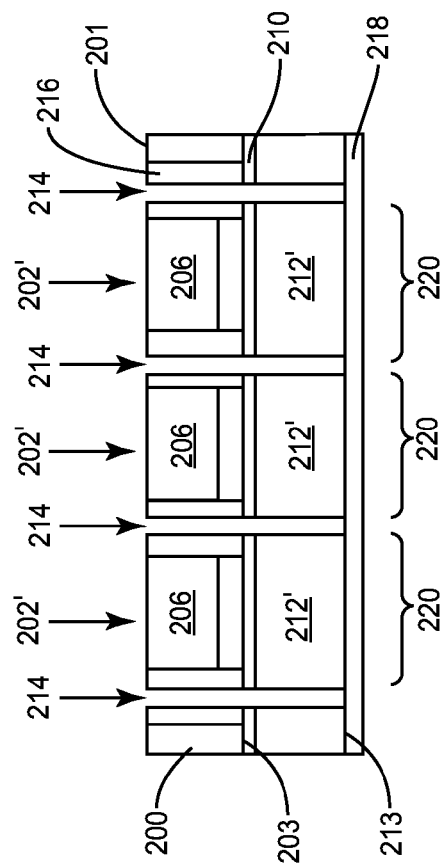

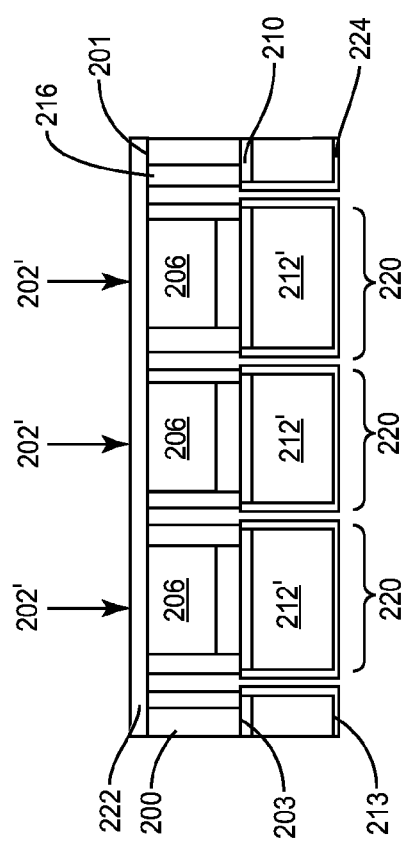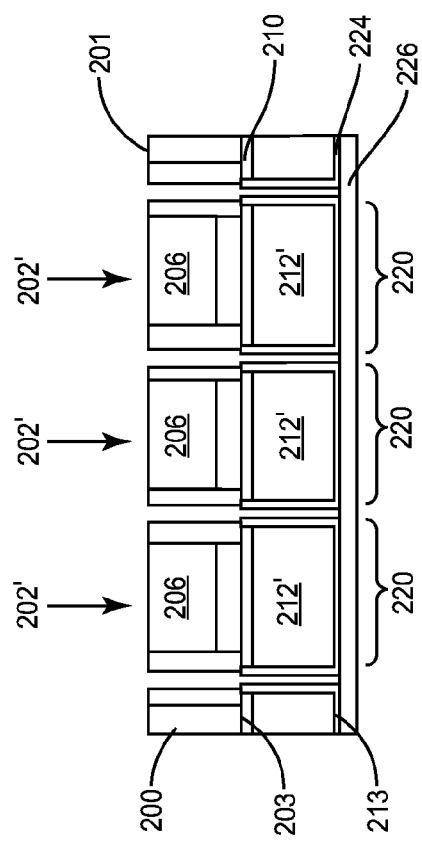

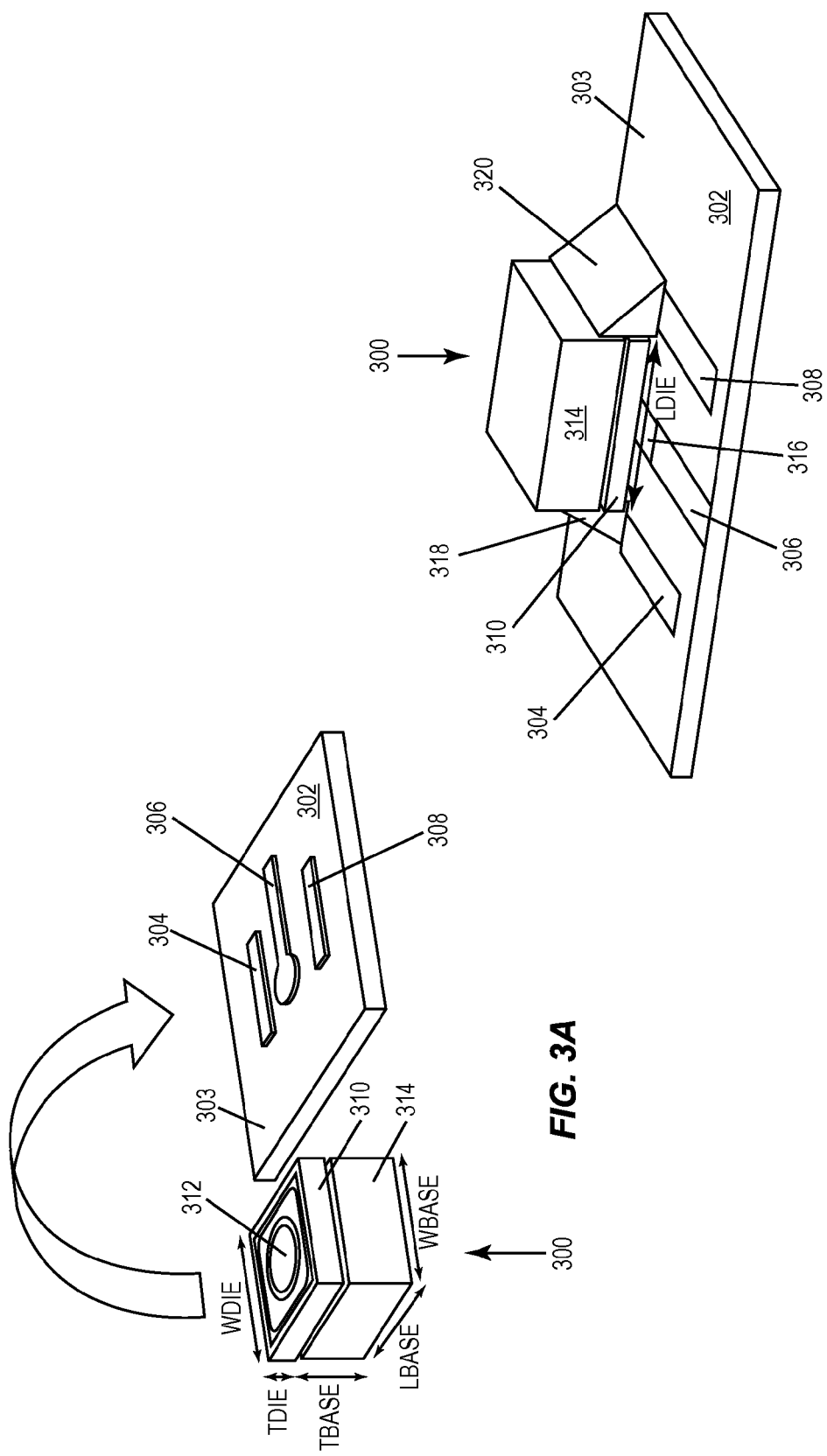

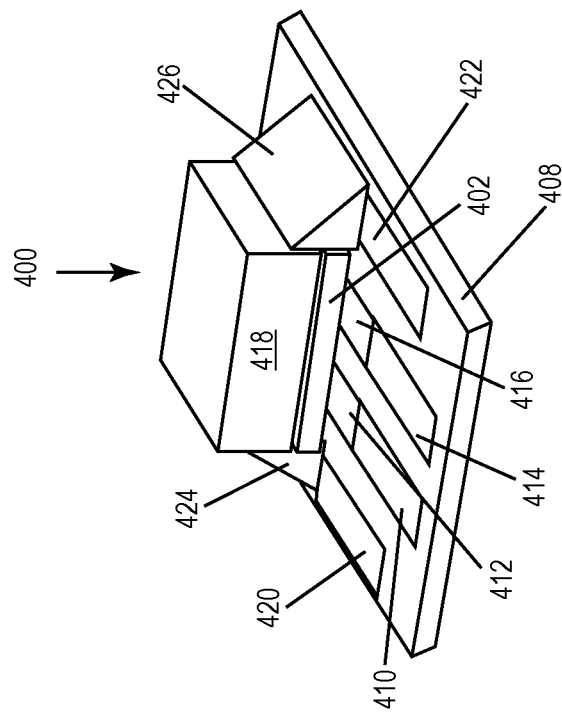
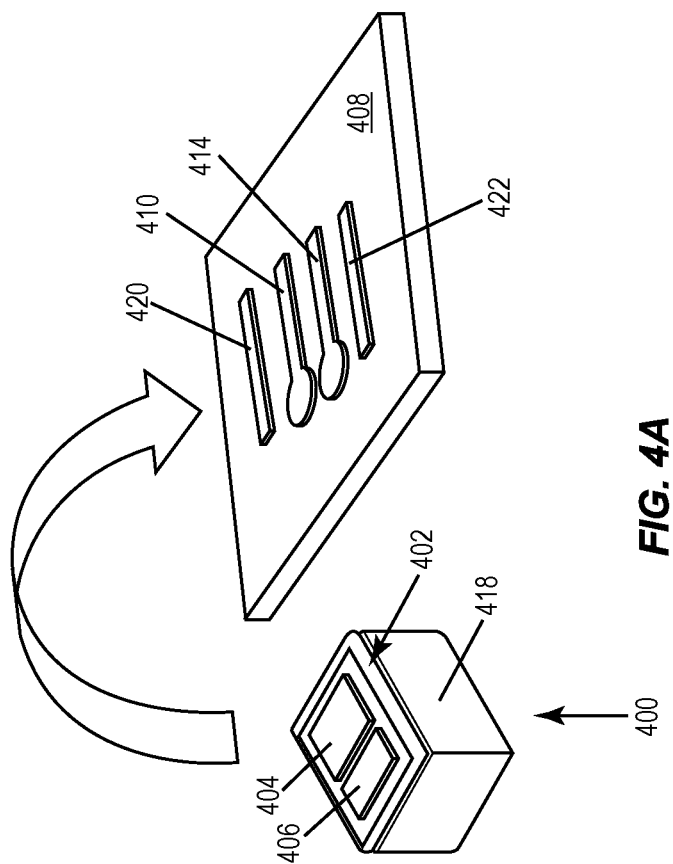
FIG. 4A
FIG. 4B

HIGH POWER SINGLE-DIE SEMICONDUCTOR PACKAGE

TECHNICAL FIELD

The instant application relates to semiconductor packages, and more particularly to single-die semiconductor packages.

BACKGROUND

High power devices such as IGBTs (insulated gate bipolar transistors), power MOSFETs (metal oxide semiconductor field effect transistors), power diodes, etc. are typically assembled by sawing (dicing) individual dies from a wafer and placing the individual dies in packages. Electrical connections are made to each packaged die by wire bonding, metal ribbons, metal clips, etc. It is advantageous for many power devices with a vertical current path between electrodes at opposing sides of the die to be made as thin as possible to reduce the on-state resistance (Rdson) of the device. However, conventional high power semiconductor packages are not designed for very thin dies, e.g. dies <50 μm thick. Dies that are less than 50 μm thick are highly susceptible to cracking during the sawing (dicing) and die attach processes due to the forces involved. As such, conventional semiconductor dies typically have a vertical current path much thicker than 50 μm. Dies of such thickness have higher Rdson and inefficient heat transfer due to the thick semiconductor limitation. In addition, most conventional packages provide only single-sided or double-sided cooling which lowers continuous heat dissipation for high power devices.

SUMMARY

According to an embodiment of a semiconductor package, the package comprises a single semiconductor die and an electrically and thermally conductive base. The single semiconductor die comprises a semiconductor body having opposing first and second surfaces and insulated sides between the first and second surfaces. The single semiconductor die further includes a first electrode at the first surface and a second electrode at the second surface. The single semiconductor die has a defined thickness measured between the first and second surfaces, a defined width measured along one of the insulated sides, and a defined length measured along another one of the insulated sides. The base is attached to the second electrode at the second surface of the single semiconductor die. The base has the same length and width as the single semiconductor die.

According to an embodiment of a method of manufacturing semiconductor packages, the method comprises: thinning a semiconductor wafer at a second side of the wafer opposing a first side of the wafer, the wafer having a plurality of semiconductor dies spaced apart from one another at the first side; attaching an electrically and thermally conductive base substrate to the thinned wafer at the second side; separating the semiconductor dies from each other into singular semiconductor dies after the base substrate is attached to the second side of the thinned wafer; filling gaps between adjacent ones of the singular semiconductor dies with an insulating material; and separating the base substrate along lines aligned with the gaps to form individual semiconductor packages, each semiconductor package including one of the singular semiconductor dies and a singular section of the base substrate attached to that die, the sidewalls of each die remaining covered by the insulating material in the individual semiconductor packages.

According to an embodiment of a semiconductor assembly, the assembly comprises a substrate and a semiconductor package. The substrate has a plurality of conductive regions at a mounting surface of the substrate. The semiconductor package is on the mounting surface of the substrate and comprises a single semiconductor die and an electrically and thermally conductive base. The single semiconductor die comprises a semiconductor body having opposing first and second surfaces and insulated sides between the first and second surfaces, a first electrode at the first surface electrically connected to a conductive region of the substrate, and a second electrode at the second surface. The single semiconductor die has a defined thickness measured between the first and second surfaces, a defined width measured along one of the insulated sides, and a defined length measured along another one of the insulated sides. The base is attached to the second electrode at the second surface of the single semiconductor die. The base has the same length and width as the single semiconductor die and is electrically connected to a different conductive region of the substrate than the first electrode.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings:

FIGS. 2A through 2L illustrate sectional views of a semiconductor wafer during different stages of a method of manufacturing single-die semiconductor packages from the semiconductor wafer;

FIGS. 3A and 3B illustrate different perspective views of a semiconductor assembly with a single-die semiconductor package according to an embodiment;

FIGS. 4A and 4B illustrate different perspective views of a semiconductor assembly with a single-die semiconductor package according to another embodiment.

DETAILED DESCRIPTION

Embodiments described herein provide a single-die semiconductor package which can support ultra-thin semiconductor dies, thereby reducing on-state resistance for devices with a vertical current path and increasing the heat transfer capability of the package. The single-die semiconductor package further allows for up to six-sided cooling of the device, thereby increasing continuous heat dissipation.

Figure 1C:
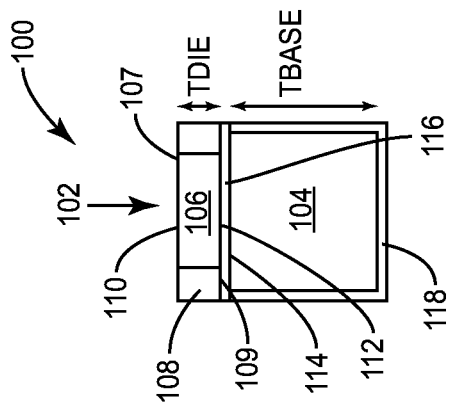
FIGS. 1A through 1C illustrate different views of a single-die semiconductor package according to an embodiment.
Figure 1B:
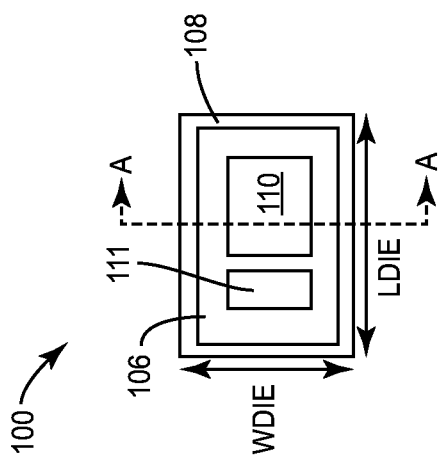
Figure 1A:
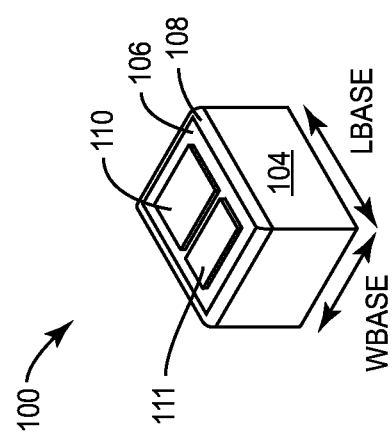

FIG. 1A illustrates a perspective view of an embodiment of a single-die semiconductor package 100, FIG. 1B illustrates a top-down plan view of the single-die semiconductor package 100, and FIG. 1C illustrates a sectional view of the package 100 along the line labeled A-A' in FIG. 1B. The semiconductor package 100 includes a single semiconductor die 102 and an electrically and thermally conductive base 104. The single semiconductor die 102 includes a semiconductor body 106 having opposing first (e.g. top) and second (e.g. bottom) surfaces 107, 109, and insulated sides 108 between the first and second surfaces 107, 109. The die 102 also includes a first electrode 110 at the first surface 107 and a second electrode 112 at the second surface 109. An additional electrode 111 can be provided at the first surface 107 of the die 102, depending on the type of device (e.g. in the case of a transistor).

The single semiconductor die 102 has a defined thickness (Tdie) measured between the first and second surfaces 107, 109, a defined width (Wdie) measured along one of the insulated sides 108, and a defined length (Ldie) measured along another one of the insulated sides 108 where Ldie Wdie. The base 104 is made of an electrically and thermally conductive material such as copper, copper alloy (e.g. Cu—Fe, Cu—Sn, Cu—Zr, Cu—Ni—Si, Cu—Cr—Sn—Zn, etc.), aluminum, aluminum alloy (e.g. Al—Ag, Al—Au, Al—Co, Al—Fe, etc.), aluminum plated with copper, etc.

In general, the base 104 is attached to the second electrode 112 at the second surface 109 of the single semiconductor die 102. In one embodiment, the base 104 has a first side 114 bonded or sintered by a joining layer 116 to the second electrode 112 of the die 102, so that the base 104 has five additional sides uncovered by the die 102. Up to six sides of the package 100 can be cooled according to this embodiment, i.e., along the five uncovered sides of the base 104 and along the first surface 107 of the single semiconductor die 102. Each side of the base 104 unattached to the single semiconductor die 102 can be covered by a protective layer 118. In the case of a copper-containing base 104, the protective layer 118 can be plated on each uncovered side of the base 104. The protective layer 118 prevents oxidation of the copper-containing base 104 and provides a solderable material for the base 104.

The base 104 has the same length (Lbase) and width (Wbase) as the single semiconductor die 102. The thickness (Tbase) of the base 104 is greater than the thickness (Tdie) of the die 102. For example, Tbase can be in the range of microns, e.g. 300 µm, 400 µm, or even thicker. In one embodiment, the semiconductor body 106 of the die 102 comprises silicon and Tdie ≤50 µm. Other die and base thickness can be realized, and depend on the type of die 102 and application for which the die 102 is designed. For example in the case of a power transistor (e.g. IGBT or power MOSFET) formed in the semiconductor body 106, Tdie can be ≤20 µm. In the case of a power diode formed in the semiconductor body 106, Tdie can be ≤10 µm. In each case, the on-state resistance (Rdson) of the die 102 is reduced by using an ultra-thin semiconductor body 106, e.g. ≤50 µm.

Such a thin semiconductor body can be realized in a semiconductor package without causing damage to the die by attaching a base substrate to the wafer from which the dies are produced. The base substrate is divided as part of the die separation process, yielding a stable support structure in the form of separate electrically and thermally conductive bases attached to each ultra-thin die before any interconnects such as bond wires, ribbons, clips, etc. are connected to the electrodes of the respective dies. Such a semiconductor package provides for reduced Rdson and increased heat transfer capability while reducing or eliminating the likelihood that the ultra-thin dies will crack during or after separation from the common wafer.

A method of manufacturing the single-die semiconductor package 100 illustrated in FIGS. 1A through 1C is described next, with reference to FIGS. 2A through 2L. FIGS. 2A through 2L illustrate sectional views during different stages of the manufacturing process.

Figure 2A:
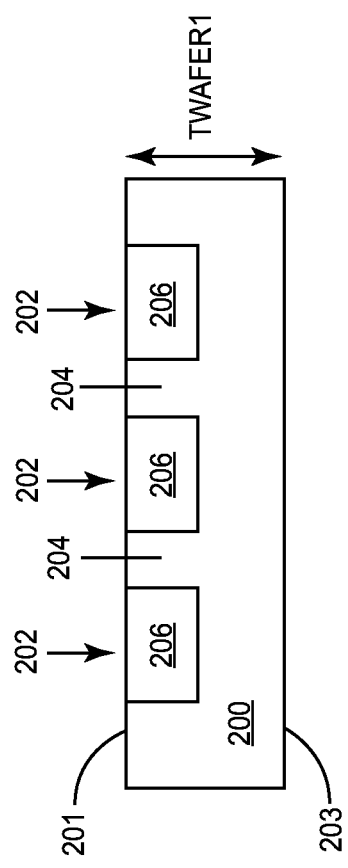

FIG. 2A shows a semiconductor wafer 200 having opposing first and second sides 201, 203. Any suitable semiconductor wafer 200 can be used, such as single element semiconductors (e.g. Si, Ge, etc.), silicon on insulator semiconductor, binary semiconductors (e.g. SiC, GaN, GaAs, etc.), ternary semiconductors, etc. with or without epitaxial layer(s). A plurality of semiconductor dies 202 are spaced apart from one another at the first side 201 of the wafer 200, e.g. by an isolation region 204 which can be an insulating material such as SiO2, an implanted region of the wafer 200, etc. Any desired type of device can be formed in the semiconductor body 206 of the dies 202 such as transistors, diodes, etc. A region of the wafer 200 forms the semiconductor body 206 of each die 202. The wafer 200 has a defined thickness (Twafer1) prior to thinning, including any epitaxial layer(s) and front side metallization which may be present. The pre-thinned thickness Twafer1 of the wafer 200 is in the range of microns, e.g. 500 µm or greater.

Figure 2B:
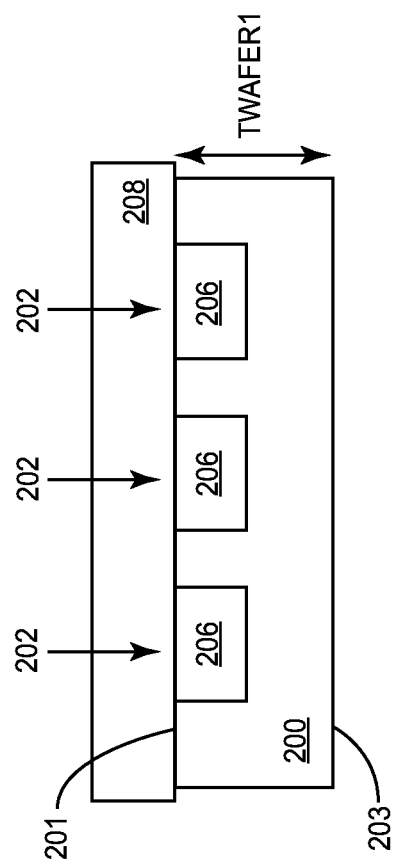

FIG. 2B shows the semiconductor wafer 200 after a support substrate 208 is attached to the wafer 200 at the first side 201 before the wafer 200 is thinned. The support substrate 208 provides support to the wafer 200 during subsequent thinning at the second side 203 of the wafer 200. In one embodiment, the support substrate 208 comprises a glass material glued to the first side 201 of the wafer 200. Other types of support substrates 208 can be used.

FIG. 2C shows the structure after the semiconductor wafer 200 is thinned at the second side 203 of the wafer 200. Any standard processing for thinning semiconductor wafers can be used to thin the wafer 200, such as mechanical grinding, chemical mechanical polishing (CMP), wet etching and atmospheric downstream plasma (ADP), dry chemical etching (DCE), etc. In one embodiment, the wafer 200 has a post-thinning thickness (Twafer2) of 50 µm or less. In the case of transistors fabricated in the semiconductor body 206 of the dies 202, Twafer2 can be 20 µm or less. In the case of diodes fabricated in the semiconductor body 206 of the dies 200, Twafer2 can be 10 µm or less. In each case, the thickness (Twafer2) of the thinned wafer 200 corresponds to the final thickness (Tdie) of the individual dies 202 after separation into individual packages, e.g. as shown in FIG. 1C. The support substrate 208 provides adequate support to the wafer 200 during the thinning process, to yield ultra-thin dies 202 with little or no damage. FIG. 2D shows the structure after an electrically conductive layer 210 is formed on the second side 203 of the thinned wafer 200. In one embodiment, the electrically conductive layer 210 is a eutectic bonding layer, such as Si/Ti/NiV/Cu/Sn or Al/Ti/NiV/AuSn. In another embodiment, the electrically conductive layer 210 is a sintering paste, such as a silver paste. In yet another embodiment, the electrically conductive layer 210 is a conductive glue film, such as a silver fillet die attach film.

Figure 2E:
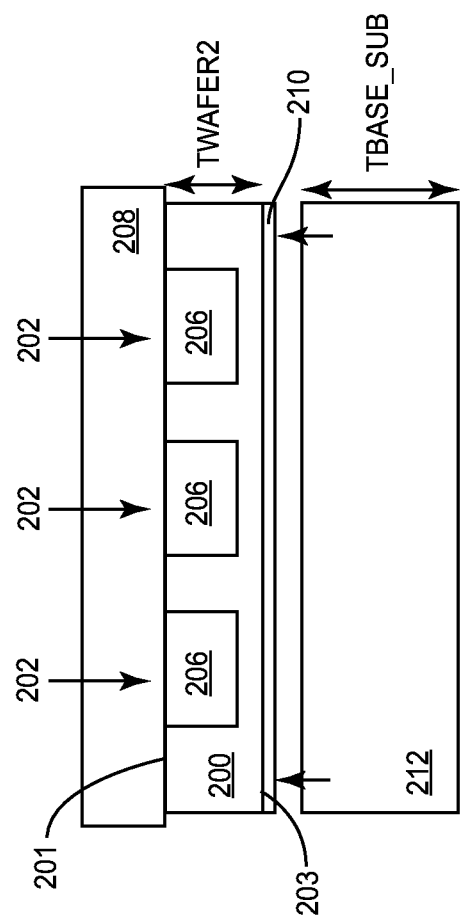

FIG. 2E shows the structure during attachment of an electrically and thermally conductive base substrate 212 to the thinned wafer 200 at the second side 203 of the wafer 200, as indicated by the upward facing arrows in FIG. 2E. The base substrate 212 can be made of any suitable electrically and thermally conductive material such as copper, copper alloy (e.g. Cu—Fe, Cu—Sn, Cu—Zr, Cu—Ni—Si, Cu—Cr—Sn—Zn, etc.), aluminum, aluminum alloy (e.g. Al—Ag, Al—Au, Al—Co, Al—Fe, etc.), aluminum plated with copper, etc. The thickness (Tbase_sub) of the base substrate 212 is significantly greater than the thickness (Twafer2) of the thinned wafer 200. For example, Tbase_sub can be 300 µm, 400 µm, or even greater. In each case, according to the illustrated embodiment shown in FIG. 2E, the electrically conductive layer 210 is interposed between the base substrate 212 and the second side 203 of the thinned wafer 200, and attaches the base substrate 212 to the thinned wafer 200.

In the case of a non-paste sintering material as the electrically conductive layer 210, a sintered connection can be formed between the base substrate 212 and the thinned wafer 200 in a single sintering process or two sintering processes.

For example, if the support substrate 208 comprises a glass material having a relatively low melting temperature, e.g. around 200° C., a partially sintered connection can be formed between the base substrate 212 and the thinned wafer 200 under pressure and at a first temperature below the melting temperature of the glass material. The partially sintered connection is strong enough to at least temporarily hold the base substrate 212 in place against the thinned wafer 200 while the support substrate 208 is removed from the thinned wafer 200. The sintered connection between the base substrate 212 and the thinned wafer 200 is strengthened under pressure and at a second temperature greater than the melting temperature of the glass material after the support substrate 208 is removed from the thinned wafer 200 (e.g. around 250° C. to 350° C. in the case of a CuSn sintering material). Alternatively, the base substrate 212 is eutectically bonded to the thinned wafer 200 at the second side 203 of the wafer 200 in the case of a eutectic bonding material as the electrically conductive layer 210. In the case of a conductive glue film, the base substrate 212 is bonded to the thinned wafer 200 at the second side 203 of the wafer 200 at around 150° C. to 250° C. with or without pressure.

Figure 2F:
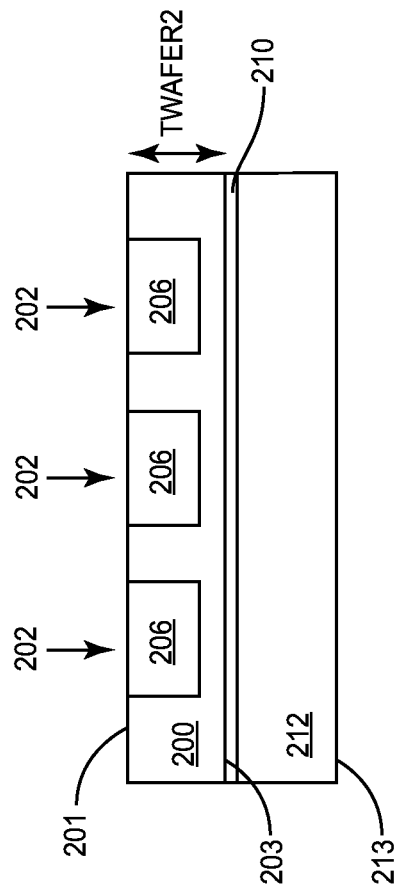

FIG. 2F shows the structure after the base substrate 212 is attached to the thinned wafer 200 at the second side 203 of the wafer 200 and the support substrate 208 is removed. In some embodiments, the side 213 of the base substrate 212 facing away from the thinned wafer can be roughened so that this side 213 of the base 212 has a greater surface area compared to other sides of the base 212. For example, a region of microstructures can be formed at this side 213 of the base substrate 212.

FIG. 2G shows the structure after the semiconductor dies 202 are separated from each other into singular semiconductor dies 202'. The base substrate 212 provides adequate support during the die separation process and during subsequent processing, minimizing cracking of the resulting ultra-thin dies 202'. Any suitable dicing (sawing) technique can be used to separate the dies 202, such as chemical etching, mechanical sawing (dicing), laser cutting, etc. The dicing (sawing) process can stop on the electrically conductive layer 210 which attaches the base substrate 212 to the second side 203 of the thinned wafer 200, so that the base substrate 212 remains fully intact after die separation. Gaps 214 exist between adjacent ones of the separated dies 202'.

FIG. 2H shows the structure after the gaps 214 between adjacent ones of the singular semiconductor dies 202' are filled with an insulating material 216. The insulating material 216 can be a laminate, compound, passivation, or any other suitable material for protecting the exposed sidewalls of the separated dies 202'. For example, organosilicate glass (Si-COH) or silicon nitride can be used. For certain types of semiconductor dies with edge sensitivity, the insulating material 216 can be selected to protect the die edge. In general, the insulating material 216 isolates the sidewalls of the separated dies 202'. The insulating material 216 can also be selected to provide passivation and/or corrosion protection.

FIG. 2I shows the structure after a first support layer 218 such as a carrier or tape is attached to the back side of the structure, i.e., the side of the structure with the base substrate 212. The first support layer 218 holds the separated dies 202' in place during separation of the base substrate 212.

FIG. 2J shows the structure after the base substrate 212 is separated along lines aligned with the gaps 214 between the separated dies 202' to form individual semiconductor packages 220 held together by the first support layer 218. Each semiconductor package 220 includes one of the separated semiconductor dies 202' and a singular section 212' of the base substrate 212 attached to that separated die 202'. The sidewalls of each separated die 202' remain covered by the insulating material 216 in the individual semiconductor packages 220, e.g. also as shown in FIGS. 1A through 1C.

According to the embodiment shown in FIG. 2J, separation of the base substrate 212 can begin at the front side of the structure where the separated dies 202' are present. The gaps 214 between the separated dies 202' are readily visible in this case. Alternatively, separation of the base substrate 212 begins at the side 213 of the base substrate 212 facing away from the separated dies 202'. Separation of the base substrate 212 can begin at this side 213, e.g. by sawing or patterning along the pattern if the gaps 214 between the separated dies 202' are known or observable. In one embodiment, infrared light can be used to detect the pattern of the separated dies 202' if the thinned wafer 200 has a thickness less than 50 um. In another embodiment, cameras facing the die side and the base substrate side of the structure can be used in coordination to detect the pattern of the separated dies 202'. In general, any suitable technique such as mechanical sawing, chemical etching (with photolithography), EDM (electro discharge machining), etc. can be used for separating the base substrate 212 to form the individual semiconductor packages 220.

FIG. 2K shows the structure after the first support layer 218 is removed from the back side of the structure and a second support layer 222, such as a carrier or tape, is attached to the front side of the structure, i.e. the side of the structure with the separated dies 202'. The second support layer 222 holds the individual packages 220 in place while a protective layer 224 is applied to the free sides of the singular base sections 212'. In the case of copper-containing base sections 212', the protective layer 224 can be plated on each free side of the base sections 212'. For example, tin, gold or silver-based plating can be used. Such plating protects the copper from oxidation and provides a solderable material for the base sections 212'. The back side 213 of the singular base sections 212' can be marked after plating by using any suitable marking technique, such as laser scribing or bar coding.

FIG. 2L shows the structure after the second support layer 218 is removed from the front side of the structure and a third support layer 226 such as a carrier or tape is attached to the back side of the structure. Remounting a support layer 226 to the back side of the structure allows for final package testing. The third support layer 226 can be an electrically conductive material, to ensure good electrical contact to the back side electrode of the individual packages 220, which is formed by the respective singular base sections 212'. The third support layer 226 can be removed after testing, yielding the individual semiconductor packages 220, e.g. of the kind shown in FIGS. 1A through 1C. The individual semiconductor packages 220 are ready for use in a higher-level assembly.

FIGS. 3A and 3B show one embodiment of a semiconductor assembly including a semiconductor package 300 of the kind previously described herein. FIG. 3A shows the semiconductor package 300 during the assembly process, which is indicated by the curved arrow in FIG. 3A, and FIG. 3B shows the assembly after package mounting.

The semiconductor assembly includes a substrate 302 having a plurality of conductive regions 304, 306, 308, such as bond pads at a mounting surface 303 of the substrate 302. The substrate 302 can include an insulating material such ceramic with a top side and/or bottom side metallization patterned to form the conductive regions 304, 306, 308. In other embodiments, the substrate 302 is a lead frame and the conductive regions 304, 306, 308 are part of the lead frame e.g. so-called die pads or lead posts. Still other types of substrates can be used as is known in the semiconductor packaging art.

The semiconductor package 300 includes a single semiconductor die comprising a semiconductor body 310 having opposing first and second surfaces and insulated sides between the first and second surfaces. The die 310 also has a first electrode 312 at the first surface electrically connected to a conductive region 306 of the substrate 302, and a second electrode (out of view) at the second surface. The die 310 has a defined thickness (Tdie) measured between the first and second surfaces, a defined width (Wdie) measured along one of the insulated sides, and a defined length (Ldie) measured along another one of the insulated sides. An electrically and thermally conductive base 314 is attached to the second electrode at the second surface of the single semiconductor die 310. The base 314 has the same length (Lbase) and width (Wbase) as the single semiconductor die 310, and is thicker (Tbase) than the die 310. The base 314 is electrically connected to a different conductive region 304, 308 of the substrate 302 than the first electrode 312.

According to the semiconductor assembly embodiment shown in FIGS. 3A and 3B, the semiconductor die 310 is a diode die and, therefore, has one electrode 312 at the first surface of the die 310 and one electrode (out of view) at the second surface of the die 310. For example, the emitter electrode 312 of the diode can be disposed at the first surface of the die 310 facing the assembly substrate 302, and the base/collector electrode (out of view) of the diode can be disposed at the second surface of the die 310 facing away from the substrate 302. The emitter electrode 312 can be bonded or sintered to the conductive region 306 of the substrate under the emitter electrode 312 by a joining layer 316 between the conductive region 306 and the emitter electrode 312. The base 314 is connected to a conductive region 304, 308 of the substrate 302 uncovered by the single semiconductor die 310 to form an electrical connection to the base/collector electrode of the diode. In one embodiment, the base 314 is connected to conductive regions 304, 308 adjacent opposing sides of the die 310 by a respective solder joint 318, 320 extending from each of these conductive regions 304, 308 to along the corresponding side of the base 314 not facing the substrate 302, i.e., lateral sides of the base 314. The conductive regions 304, 308 of the substrate 302 connected to the base 314 are at the same potential. The insulated sides of the die 310 electrically insulate the semiconductor body and the emitter electrode 312 of the die 310 from the solder joints 318, 320.

FIGS. 4A and 4B show another embodiment of a semiconductor assembly including a semiconductor package 400 of the kind previously described herein. FIG. 4A shows the semiconductor package 400 during the assembly process, which is indicated by the curved arrow in FIG. 4A, and FIG. 4B shows the assembly after package mounting.

The semiconductor assembly in FIGS. 4A and 4B is similar to the one shown in FIGS. 3A and 3B, however, the single semiconductor die 402 included in the package 400 is a transistor die instead of a diode die. For example, the die 402 can be an IGBT, MOSFET or JFET die. Transistors have three terminals. To complete the electrical connections to the respective terminals, two electrodes 404, 406 are provided at the first (top) surface of the die 402, and one electrode (out of view) is provided at the second (bottom) surface of the die 402. For example, the source/emitter and gate/base electrodes 404, 406 of the transistor can be disposed at the first surface of the die 402 facing the assembly substrate 408, and the drain/collector electrode of the transistor can be disposed at the second surface of the die 402 facing away from the substrate 408.

The gate/base electrode 406 of the die 402 can be bonded or sintered to a first conductive region 410 of the substrate 408 under the gate/base electrode 406 by a first joining layer 412 between the first conductive region 410 and the gate/base electrode 406. The source/emitter electrode 404 of the die 402 can be bonded or sintered to a second (different) conductive region 414 of the substrate 408 under the source/emitter electrode 404 by a second (different) joining layer 416 between the second conductive region 414 and the source/emitter electrode 404. The base 418 of the semiconductor package 400 is connected to a conductive region 420, 422 of the substrate 408 uncovered by the single semiconductor die 402 to form an electrical connection to the drain/collector electrode of the transistor. In one embodiment, the base 418 is connected to conductive regions 420, 422 adjacent opposing sides of the die 402 by a respective solder joint 424, 426 extending from each of these conductive regions 420, 422 along the corresponding lateral side of the base 418. The conductive regions 420, 422 of the substrate 408 connected to the base 418 are at the same potential. The insulated sides of the die 402 electrically insulate the semiconductor body and the source/emitter and gate/base electrodes 404, 406 of the die 402 from the solder joints 424, 426.

Figure 5:
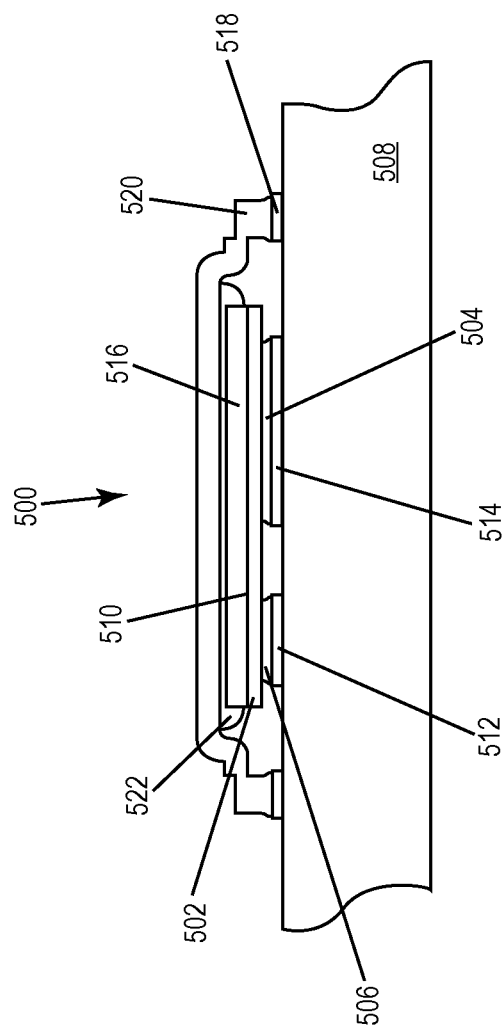
FIG. 5 illustrates a sectional view of a semiconductor assembly with a single-die semiconductor package according to yet another embodiment.

FIG. 5 shows a sectional view of yet another embodiment of a semiconductor assembly including a semiconductor package 500 of the kind previously described herein. According to this embodiment, the semiconductor die 502 is a transistor die having two electrodes 504, 506 provided at a first (bottom) surface of the die 502 facing a substrate 508 e.g. of the kind previously described herein, and one electrode 510 provided at the second (top) surface of the die 502 facing away from the substrate 508. For example, the source/emitter and gate/base electrodes 504, 506 of the transistor can be disposed at the first surface of the die 502 facing the substrate 508 and the drain/collector electrode 510 of the transistor can be disposed at the second surface of the die 502 facing away from the substrate 508.

The gate/base electrode 506 of the die 502 can be bonded or sintered to a first conductive region 512 of the substrate 508 under the gate/base electrode 506 by a first joining layer between the first conductive region 512 and the gate/base electrode 506. The source/emitter electrode 504 of the die 502 can be bonded or sintered to a second (different) conductive region 514 of the substrate 508 under the source/emitter electrode 504 by a second (different) joining layer between the second conductive region 514 and the source/emitter electrode 504. The base 516 of the package 500 is connected to a conductive region 518 of the substrate 508 uncovered by the single semiconductor die 502 by a metal connector 520 such as a clip, ribbon or bond wires extending from the conductive region 518 to along the side of the base 516 facing away from the substrate 508. The metal connector 520 can be of a single continuous construction (e.g. a clip) which connects conductive regions 518 at opposing sides of the die 502 to the side of the base 516 facing away from the substrate 508. In each case, the conductive regions 518 of the substrate 508 connected to the base 516 are at the same potential. An epoxy 522 can be used to attach the metal connector 520 to the top side of the base 516, i.e., the side of the base 516 facing away from the substrate 508. In each case, the insulated sides of the die 502 electrically insulate the semiconductor body and the source/emitter and gate/base electrodes 504, 506 of the die 502 from the metal connector 520. In yet other embodiments, the base 516 can face the substrate 508 instead of the die 502. According to this embodiment, the base 516 is connected to a conductive region of the substrate 508 under the base 516 and the electrode(s) 504, 506 at the other side of the semiconductor package 500 are connected to other conductive regions of the substrate 508 by solder joints or metal connectors as previously described herein.

In general, the individual semiconductor package with ultra-thin single die described herein can be included as a component or chip in any conventional semiconductor package. The individual semiconductor package can be bonded/attached just like any conventional power chip in standard packages with standard chip bond, wire bond, clip, etc., technology. Some purely illustrative examples of standard packages in which the individual semiconductor package described herein can be used include TO2XX, SON, TDSON8, TSDSON8, WISON8, etc. The individual semiconductor package described herein can be used as a single chip or with other chips in the same package, e.g. in a chip-by-chip, chip-on-chip, chip-by-chip-by-chip, chip-by-chip-on-chip, etc., configuration.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
    a single semiconductor die comprising:
        a semiconductor body having opposing first and second surfaces, and insulated sides between the first and second surfaces;
        a first electrode at the first surface; and
        a second electrode at the second surface,
        the single semiconductor die having a defined thickness measured between the first and second surfaces, a defined width measured along one of the insulated sides, and a defined length measured along another one of the insulated sides; and
    an electrically and thermally conductive base attached to the second electrode at the second surface of the single semiconductor die, the base having the same length and width as the single semiconductor die,
    wherein each side of the base unattached to the single semiconductor die is covered by a protective layer.

2. The semiconductor package according to claim 1, wherein the defined thickness of the single semiconductor die is 50 microns or less.

3. The semiconductor package according to claim 2, wherein a transistor is formed in the semiconductor body, the single semiconductor die further comprises a third electrode at the first surface of the semiconductor body, and the defined thickness of the single semiconductor die is 20 microns or less.

4. The semiconductor package according to claim 2, wherein a diode is formed in the semiconductor body and the defined thickness of the single semiconductor die is 10 microns or less.

5. The semiconductor package according to claim 1, wherein the base comprises copper and the protective layer is plated on each side of the base unattached to the single semiconductor die.

6. The semiconductor package according to claim 1, wherein a side of the base facing away from the single semiconductor die has a roughened surface with microstructures so that this side of the base has a greater surface area compared to other sides of the base.

7. A semiconductor assembly, comprising:
    a substrate having a plurality of conductive regions at a mounting surface of the substrate; and
    a semiconductor package on the mounting surface of the substrate, the semiconductor package comprising:
        a single semiconductor die comprising:
            a semiconductor body having opposing first and second surfaces, and insulated sides between the first and second surfaces;
            a first electrode at the first surface electrically connected to a conductive region of the substrate; and
            a second electrode at the second surface,
            the single semiconductor die having a defined thickness measured between the first and second surfaces, a defined width measured along one of the insulated sides, and a defined length measured along another one of the insulated sides; and
        an electrically and thermally conductive base attached to the second electrode at the second surface of the single semiconductor die, the base having the same length and width as the single semiconductor die and electrically connected to a different conductive region of the substrate than the first electrode,
    wherein the first surface of the semiconductor body faces the substrate, the first electrode is bonded or sintered to a conductive region of the substrate under the first electrode by a joining layer between the conductive region and the first electrode, and the base is connected to a conductive region of the substrate uncovered by the single semiconductor die.

8. The semiconductor assembly according to claim 7, wherein a transistor is formed in the semiconductor body, the single semiconductor die further comprises a third electrode at the first surface of the semiconductor body electrically connected to a different conductive region of the substrate than the first electrode and the base, and the defined thickness of the single semiconductor die is 20 microns or less.

9. The semiconductor assembly according to claim 7, wherein a diode is formed in the semiconductor body and the defined thickness of the single semiconductor die is 10 microns or less.

10. The semiconductor assembly according to claim 7, wherein the base is connected to a conductive region of the substrate uncovered by the single semiconductor die by a solder joint extending from the conductive region to along a side of the base not facing the substrate, and wherein the insulated sides of the semiconductor body electrically insulate the semiconductor body and the first electrode from the solder joint.

11. A semiconductor package, comprising:
    a single semiconductor die comprising:
        a semiconductor body having opposing first and second surfaces, and insulated sides between the first and second surfaces;

a first electrode at the first surface; and
a second electrode at the second surface,
the single semiconductor die having a defined thickness measured between the first and second surfaces, a defined width measured along one of the insulated sides, and a defined length measured along another one of the insulated sides; and
an electrically and thermally conductive base attached to the second electrode at the second surface of the single semiconductor die, the base having the same length and width as the single semiconductor die,
wherein the base has a first side bonded or sintered by a joining layer to the second electrode at the second surface of the single semiconductor die and five additional sides uncovered by the single semiconductor die.

12. A semiconductor package, comprising:
a single semiconductor die comprising:
a semiconductor body having opposing first and second surfaces, and insulated sides between the first and second surfaces;
a first electrode at the first surface; and
a second electrode at the second surface,
the single semiconductor die having a defined thickness measured between the first and second surfaces, a defined width measured along one of the insulated sides, and a defined length measured along another one of the insulated sides; and
an electrically and thermally conductive base attached to the second electrode at the second surface of the single semiconductor die, the base having the same length and width as the single semiconductor die,
wherein a side of the base facing away from the single semiconductor die has a roughened surface with microstructures so that this side of the base has a greater surface area compared to other sides of the base.

13. A semiconductor assembly, comprising:
a substrate having a plurality of conductive regions at a mounting surface of the substrate; and
a semiconductor package on the mounting surface of the substrate, the semiconductor package comprising:
a single semiconductor die comprising:
a semiconductor body having opposing first and second surfaces, and insulated sides between the first and second surfaces;
a first electrode at the first surface electrically connected to a conductive region of the substrate; and
a second electrode at the second surface,
the single semiconductor die having a defined thickness measured between the first and second surfaces, a defined width measured along one of the insulated sides, and a defined length measured along another one of the insulated sides; and
an electrically and thermally conductive base attached to the second electrode at the second surface of the single semiconductor die, the base having the same length and width as the single semiconductor die and electrically connected to a different conductive region of the substrate than the first electrode,
wherein the base is connected to a conductive region of the substrate uncovered by the single semiconductor die by a metal connector extending from the conductive region to along the side of the base facing away from the substrate, and wherein the insulated sides of the semiconductor body electrically insulate the semiconductor body and the first electrode from the metal connector.

* * * * *